(12) United States Patent
Negley et al.

(10) Patent No.: US 7,901,111 B2
(45) Date of Patent: Mar. 8, 2011

(54) LIGHTING DEVICE AND LIGHTING METHOD

(75) Inventors: Gerald H. Negley, Durham, NC (US); Antony Paul Van De Ven, Hong Kong (CN); Paul Kenneth Pickard, Morrisville, NC (US)

(73) Assignee: Cree, Inc., Durham, NC (US)

( * ) Notice: Subject to any disclaimer, the term of this patent is extended or adjusted under 35 U.S.C. 154(b) by 457 days.

(21) Appl. No.: 11/947,323

(22) Filed: Nov. 29, 2007

(65) Prior Publication Data
US 2008/0130265 A1 Jun. 5, 2008

Related U.S. Application Data

(60) Provisional application No. 60/861,830, filed on Nov. 30, 2006.

(51) Int. Cl.
*F21V 9/00* (2006.01)
*F21V 9/16* (2006.01)
(52) U.S. Cl. ......... 362/293; 362/260; 362/612; 362/259; 362/800
(58) Field of Classification Search .................. 362/230, 362/231, 259, 293, 260, 612
See application file for complete search history.

(56) References Cited

U.S. PATENT DOCUMENTS

| | | | |
|---|---|---|---|
| 5,803,579 | A | 9/1998 | Turnbull et al. |
| 5,813,753 | A | 9/1998 | Vriens et al. |
| 6,132,072 | A | 10/2000 | Turnbull et al. |
| 6,155,699 | A | 12/2000 | Miller et al. |
| 6,212,213 | B1 | 4/2001 | Weber et al. |
| 6,234,648 | B1 | 5/2001 | Borner et al. |
| 6,273,589 | B1 | 8/2001 | Weber et al. |
| 6,513,949 | B1 | 2/2003 | Marshall et al. |
| 6,538,371 | B1 | 3/2003 | Duggal et al. |
| 6,550,949 | B1 | 4/2003 | Bauer et al. |
| 6,552,495 | B1 | 4/2003 | Chang |
| 6,577,073 | B2 | 6/2003 | Shimizu et al. |

(Continued)

FOREIGN PATENT DOCUMENTS

EP  1 566 848  8/2005

(Continued)

OTHER PUBLICATIONS

Dichroic Filter Array Patented Patterned Coatings Technology, 2006 (at least as early as Sep. 2006), 2 pages.
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.

(Continued)

*Primary Examiner* — Anabel M Ton
(74) *Attorney, Agent, or Firm* — Burr & Brown (57) ABSTRACT

A lighting device, comprising a solid state light emitter and a light filter. At least a portion of light emitted by the light emitter contacts the filter, and at least part of the light passes through the filter. Also, such lighting devices further comprising lumiphor, in which at least some of the first part of the light is absorbed by the lumiphor, which then emits light, and at least a portion of any light emitted by the lumiphor directed toward the filter is reflected by the filter. Also, a method of lighting, comprising illuminating a solid state light emitter in such devices. Also, a lighting device, comprising a solid state light emitter; a lumiphor and filter means for allowing at least a portion of light emitted by the light emitter to pass through and for reflecting a second portion of light emitted by the lumiphor after the lumiphor is excited.

33 Claims, 4 Drawing Sheets

U.S. PATENT DOCUMENTS

| | | | |
|---|---|---|---|
| 6,600,175 | B1 | 7/2003 | Baretz et al. |
| 6,638,668 | B2 | 10/2003 | Buchsbaum et al. |
| 6,692,136 | B2 | 2/2004 | Marshall et al. |
| 6,730,940 | B1 | 5/2004 | Steranka et al. |
| 6,744,077 | B2 | 6/2004 | Trottier et al. |
| 6,784,463 | B2 | 8/2004 | Camras et al. |
| 6,817,735 | B2 | 11/2004 | Shimizu et al. |
| 6,841,804 | B1 | 1/2005 | Chen et al. |
| 6,914,267 | B2 | 7/2005 | Fukasawa et al. |
| 6,936,857 | B2 | 8/2005 | Doxsee et al. |
| 6,994,453 | B2 | 2/2006 | Blanchard |
| 7,004,602 | B2 | 2/2006 | Waters |
| 7,005,679 | B2 | 2/2006 | Tarsa et al. |
| 7,008,078 | B2 | 3/2006 | Shimizu et al. |
| 7,014,336 | B1 | 3/2006 | Ducharme et al. |
| 7,066,623 | B2 | 6/2006 | Lee et al. |
| 7,091,653 | B2 | 8/2006 | Ouderkirk et al. |
| 7,095,056 | B2 | 8/2006 | Vitta et al. |
| 7,144,121 | B2 | 12/2006 | Minano et al. |
| 7,157,839 | B2 | 1/2007 | Ouderkirk et al. |
| 7,213,940 | B1 | 5/2007 | Van De Ven et al. |
| 7,360,937 | B2 | 4/2008 | Han et al. |
| 7,625,098 | B2 * | 12/2009 | Rains et al. .................. 362/231 |
| 2002/0084748 | A1 | 7/2002 | Ayala et al. |
| 2003/0030063 | A1 | 2/2003 | Sosniak et al. |
| 2003/0146411 | A1 | 8/2003 | Srivastava et al. |
| 2004/0105261 | A1 | 6/2004 | Ducharme et al. |
| 2004/0217364 | A1 | 11/2004 | Tarsa et al. |
| 2005/0082974 | A1 | 4/2005 | Fukasawa et al. |
| 2006/0002141 | A1 | 1/2006 | Ouderkirk et al. |
| 2006/0012989 | A1 | 1/2006 | Lee |
| 2006/0105482 | A1 | 5/2006 | Alferink et al. |
| 2007/0258229 | A1 | 11/2007 | Weaver et al. |
| 2008/0006815 | A1 | 1/2008 | Wang et al. |
| 2008/0054281 | A1 | 3/2008 | Narendran et al. |
| 2008/0079161 | A1 | 4/2008 | Kim |

FOREIGN PATENT DOCUMENTS

| | | |
|---|---|---|
| JP | 10-163535 | 6/1998 |
| JP | 2003-515956 | 5/2003 |
| JP | 2003-529889 | 10/2003 |
| JP | 2004-080046 | 3/2004 |
| JP | 2004-103443 | 4/2004 |
| JP | 2004-356116 | 12/2004 |
| JP | 2005-142311 | 6/2005 |
| WO | 2004/068597 | 8/2004 |
| WO | 2004/100226 | 11/2004 |
| WO | WO 2005/124877 | 12/2005 |

OTHER PUBLICATIONS

U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/755,162, filed May 30, 2007.
U.S. Appl. No. 11/856,421, filed Sep. 17, 2007.
U.S. Appl. No. 11/854,744, filed Sep. 13, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/939,052, filed Nov. 13, 2007.
U.S. Appl. No. 11/939,059, filed Nov. 13, 2007.
U.S. Appl. No. 11/877,038, filed Oct. 23, 2007.
U.S. Appl. No. 11/870,679, filed Oct. 11, 2007.
U.S. Appl. No. 11/948,041, filed Nov. 30, 2007.
U.S. Appl. No. 11/613,714, filed Dec. 20, 2006.
U.S. Appl. No. 11/736,761, filed Apr. 18, 2007.
U.S. Appl. No. 11/763,799, filed Apr. 18, 2007.
U.S. Appl. No. 12/117,122, filed May 8, 2008.
U.S. Appl. No. 12/117,131, filed May 8, 2008.
U.S. Appl. No. 12/117,136, filed May 8, 2008.
U.S. Appl. No. 12/248,220, filed Oct. 9, 2008.
U.S. Appl. No. 11/948,021, filed Nov. 30, 2007.
U.S. Appl. No. 12/277,745, filed Nov. 25, 2008.
U.S. Appl. No. 11/951,626, filed Dec. 6, 2007.
U.S. Appl. No. 12/035,604, filed Feb. 22, 2008.
U.S. Appl. No. 12/117,148, filed May 8, 2008.
U.S. Appl. No. 12/117,271, filed May 8, 2008.
U.S. Appl. No. 12/051,212, filed Mar. 19, 2008.
Van de Ven et al., "Warm White Illumination with High CRI and High Efficacy by Combining 455 nm Excited Yellowish Phosphor LEDs and RED AlInGaP LEDs", First International Conference on White LEDs and Solid State Lighting.
Cree® XLamp® XR-E Series LED Binning and Labeling.
Zhu et al., "Optimizing the Performance of Remote Phosphor LED," First International Conference on White LEDs and Solid State Lighting, 2007, pp. 1-5.
Kim et al., "Strongly Enhanced Phosphor Efficiency in GaInN White Light-Emitting Diodes Using Remote Phosphor Configuration and Diffuse Reflector Cup", Japanese Journal of Applied Physics, vol. 44, Now. 21, 2005, pp. L649-L651.

* cited by examiner

LIGHTING DEVICE AND LIGHTING METHOD

CROSS-REFERENCE TO RELATED APPLICATIONS

This application claims the benefit of U.S. Provisional Patent Application No. 60/861,830, filed Nov. 30, 2006, the entirety of which is incorporated herein by reference.

FIELD OF THE INVENTION(S)

The present inventive subject matter relates to a lighting device, in particular, a device which includes one or more solid state light emitters. In some aspects, the present inventive subject matter relates to a lighting device which includes one or more light emitting diode chips and one or more luminescent materials. The present inventive subject matter is also directed to lighting methods.

BACKGROUND OF THE INVENTION(S)

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient than solid state light emitters, such as light emitting diodes.

In addition, as compared to the normal lifetimes of solid state light emitters, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes (e.g., 10,000-20,000 hours) than incandescent lights, but provide less favorable color reproduction.

Color reproduction is typically measured using the Color Rendering Index (CRI Ra). CRI Ra is a modified average of the relative measurement of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower). Sodium lights are used, e.g., to light highways—driver response time, however, significantly decreases with lower CRI Ra values (for any given brightness, legibility decreases with lower CRI Ra).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters, e.g., light emitting diodes, can be used in place of incandescent lights, fluorescent lights and other light-generating devices in a wide variety of applications. In addition, where light emitting diodes are already being used, efforts are ongoing to provide light emitting diodes which are improved, e.g., with respect to energy efficiency, color rendering index (CRI Ra), contrast, efficacy (lm/W), low cost, and/or duration of service.

Light emitting diodes are well-known semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present inventive subject matter can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The expression "light emitting diode" is used herein to refer to the basic semiconductor diode structure (i.e., the chip). The commonly recognized and commercially available light emitting diode ("LED") that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Although the development of light emitting diodes has in many ways revolutionized the lighting industry, some of the characteristics of light emitting diodes have presented challenges, some of which have not yet been fully met. For example, the emission spectrum of any particular light emitting diode is typically concentrated around a single wavelength (as dictated by the light emitting diode's composition and structure), which is desirable for some applications, but not desirable for others, (e.g., for providing lighting, such an emission spectrum provides a very low CRI Ra).

Because light that is perceived as white is necessarily a blend of light of two or more colors (or wavelengths), no single light emitting diode junction has been developed that can produce white light. "White" light emitting diode lamps have been produced which have a light emitting diode pixel/cluster formed of respective red, green and blue light emitting diodes. Other "white" light emitting diode lamps have been produced which include (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

The 1931 CIE Chromaticity Diagram (an international standard for primary colors established in 1931), and the 1976 CIE Chromaticity Diagram (similar to the 1931 Diagram but modified such that similar distances on the Diagram represent similar perceived differences in color) provide useful reference for defining colors as weighted sums of primary colors.

Light emitting diodes can thus be used individually or in any combinations, optionally together with one or more luminescent material (e.g., phosphors or scintillators), to generate light of any desired perceived color (including white). Accordingly, the areas in which efforts are being made to replace existing light sources with light emitting diode light sources, e.g., to improve energy efficiency, color rendering index (CRI Ra), efficacy (lm/W), and/or duration of service, are not limited to any particular color or color blends of light.

Figure 1:
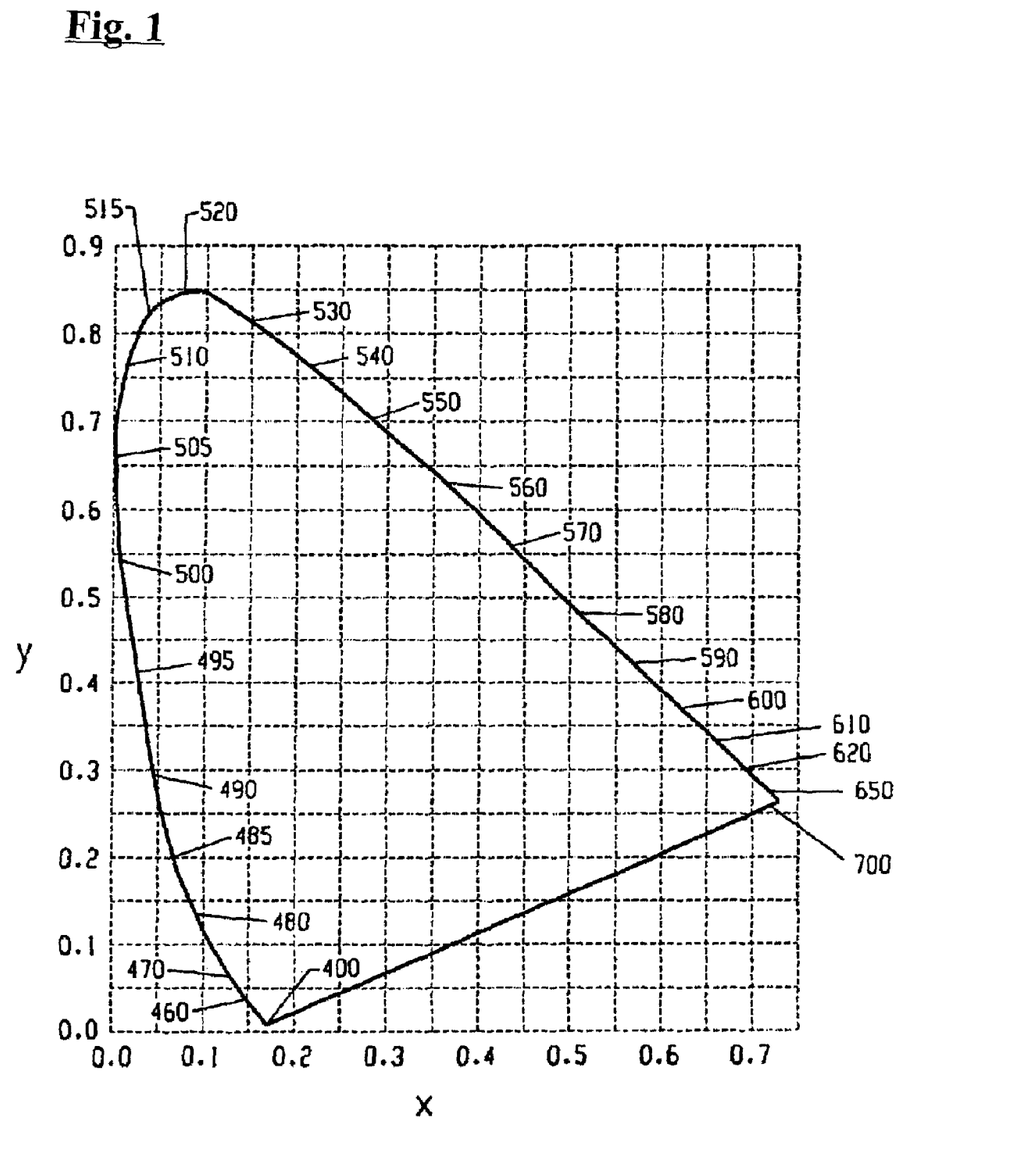
FIG. 1 shows the 1931 CIE Chromaticity Diagram.
Figure 2:
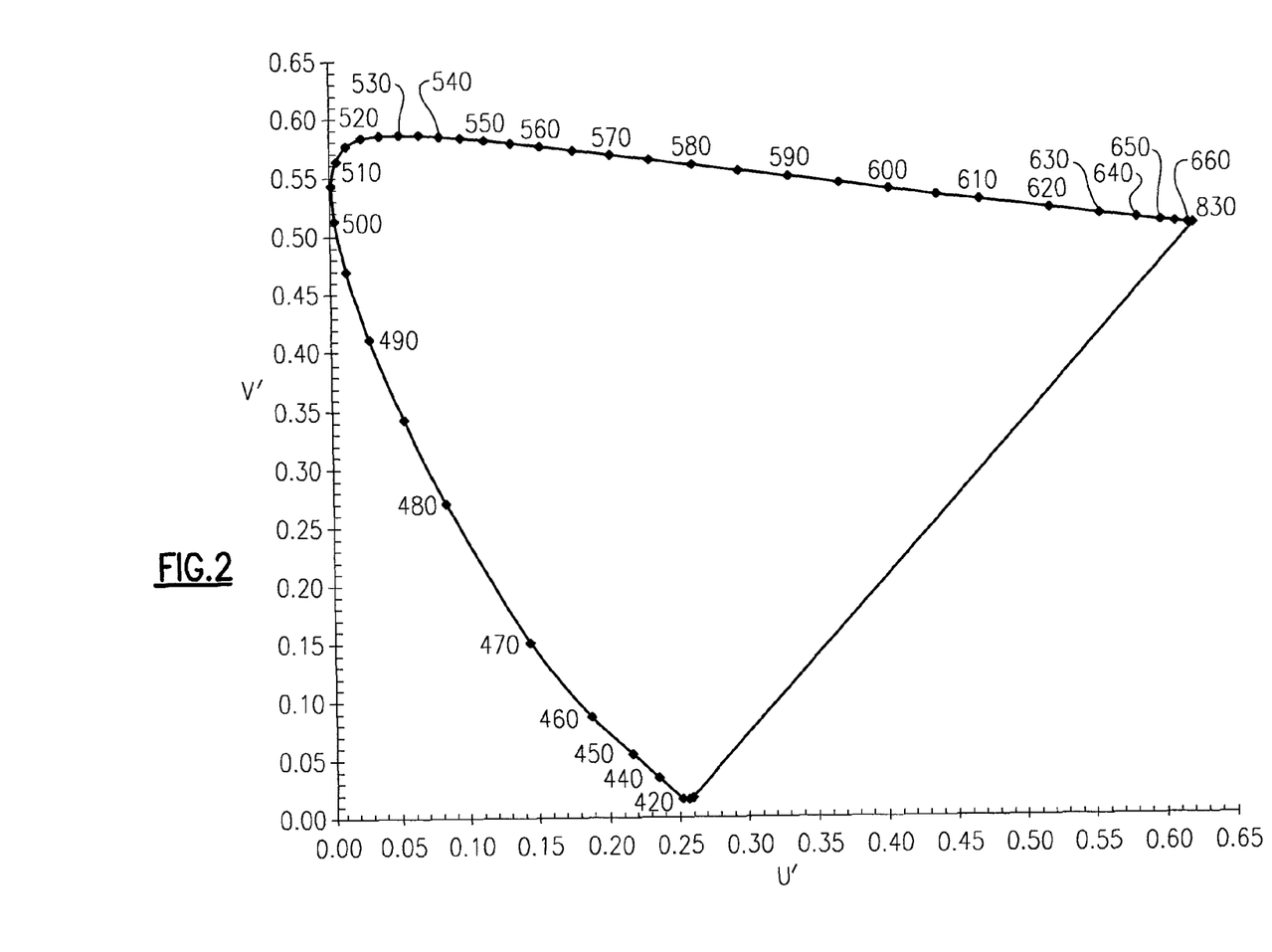
FIG. 2 shows the 1976 Chromaticity Diagram.
Figure 3:
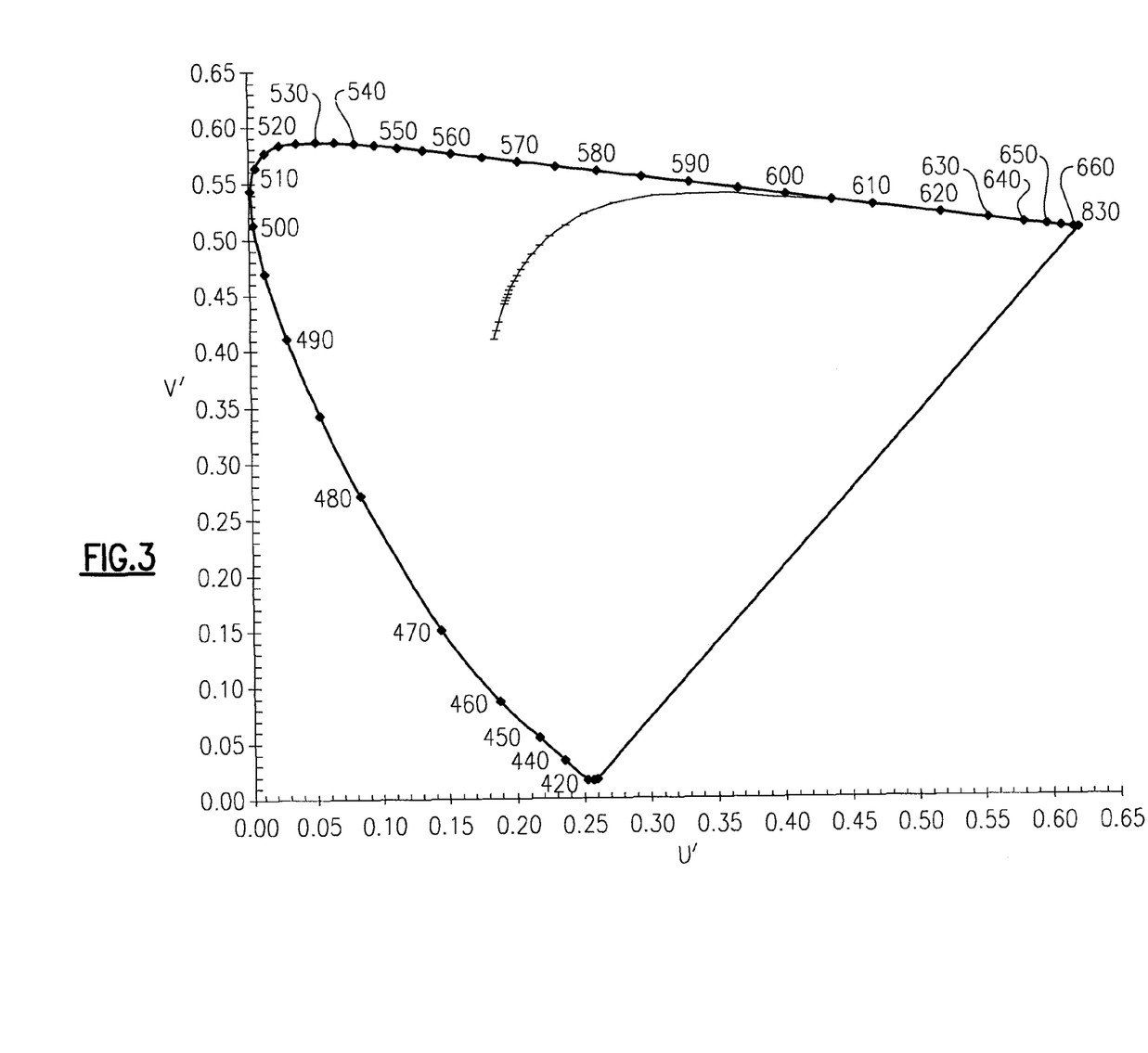
FIG. 3 shows the 1976 Chromaticity Diagram, including the blackbody locus.

Aspects related to the present inventive subject matter can be represented on either the 1931 CIE (Commission Internationale de l'Eclairage) Chromaticity Diagram or the 1976 CIE Chromaticity Diagram. FIG. 1 shows the 1931 CIE Chromaticity Diagram. FIG. 2 shows the 1976 Chromaticity Diagram. FIG. 3 shows the 1976 Chromaticity Diagram, including the blackbody locus. Persons of skill in the art are familiar with these diagrams, and these diagrams are readily available (e.g., by searching "CIE Chromaticity Diagram" on the internet).

The CIE Chromaticity Diagrams map out the human color perception in terms of two CIE parameters x and y (in the case of the 1931 diagram) or u' and v' (in the case of the 1976 diagram). For a technical description of CIE chromaticity diagrams, see, for example, "Encyclopedia of Physical Science and Technology", vol. 7, 230-231 (Robert A Meyers ed., 1987). The spectral colors are distributed around the edge of the outlined space, which includes all of the hues perceived by the human eye. The boundary line represents maximum saturation for the spectral colors. As noted above, the 1976 CIE Chromaticity Diagram is similar to the 1931 Diagram, except that the 1976 Diagram has been modified such that similar distances on the Diagram represent similar perceived differences in color.

In the 1931 Diagram, deviation from a point on the Diagram can be expressed either in terms of the coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues which would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2 + \Delta v'^2)^{1/2}$, and the hues defined by a locus of points which are each a common distance from a specified hue consist of hues which would each be perceived as differing from the specified hue to a common extent.

The chromaticity coordinates and the CIE chromaticity diagrams illustrated in FIGS. 1-3 are explained in detail in a number of books and other publications, such as pages 98-107 of K. H. Butler, "Fluorescent Lamp Phosphors" (The Pennsylvania State University Press 1980) and pages 109-110 of G. Blasse et al., "Luminescent Materials" (Springer-Verlag 1994), both incorporated herein by reference.

The chromaticity coordinates (i.e., color points) that lie along the blackbody locus obey Planck's equation: $E(\lambda) = A\lambda^{-5}/(e^{(B/T)}-1)$, where E is the emission intensity, $\lambda$ is the emission wavelength, T the color temperature of the blackbody and A and B are constants. Color coordinates that lie on or near the blackbody locus yield pleasing white light to a human observer. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants which produce light which is on or near the blackbody locus can thus be described in terms of their color temperature.

A wide variety of luminescent materials are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light. The expression "lumiphor", as used herein, refers to any luminescent element, i.e., any element which includes a luminescent material.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished by adding the luminescent materials to a clear or translucent encapsulant material (e.g., epoxy-based, silicone-based, glass-based or metal oxide-based material) as discussed above, for example by a blending or coating process.

For example, one representative example of a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. The first resin portion can be obtained by filling the cup reflector with a resin material and curing it after the light emitting diode chip has been mounted onto the bottom of the cup reflector and then has had its cathode and anode electrodes electrically connected to the leads by way of wires. A luminescent material can be dispersed in the first resin portion so as to be excited with the light A that has been emitted from the light emitting diode chip, the excited luminescent material produces fluorescence ("light B") that has a longer wavelength than the light A, a portion of the light A is transmitted through the first resin portion including the luminescent material, and as a result, light C, as a mixture of the light A and light B, is used as illumination.

As noted above, "white LED lamps" (i.e., lights which are perceived as being white or near-white) have been investigated as potential replacements for white incandescent lamps. A representative example of a white LED lamp includes a package of a blue light emitting diode chip, made of indium gallium nitride (InGaN) or gallium nitride (GaN), coated with a phosphor such as YAG. In such an LED lamp, the blue light emitting diode chip produces an emission with a wavelength of about 450 nm, and the phosphor produces yellow fluorescence with a peak wavelength of about 550 nm on receiving that emission. For instance, in some designs, white light emitting diode lamps are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light. Another type uses a blue or violet light emitting diode chip which is combined with phosphor materials that produce red or orange and green or yellowish-green light rays. In such a lamp, part of the blue or violet light emitted by the light emitting diode chip excites the phosphors, causing the phosphors to emit red or orange and yellow or green light rays. These rays, combined with the blue or violet rays, can produce the perception of white light.

As also noted above, in another type of LED lamp, a light emitting diode chip that emits an ultraviolet ray is combined with phosphor materials that produce red (R), green (G) and blue (B) light rays. In such an "RGB LED lamp", the ultraviolet ray that has been radiated from the light emitting diode chip excites the phosphor, causing the phosphor to emit red, green and blue light rays which, when mixed, are perceived by the human eye as white light. Consequently, white light can also be obtained as a mixture of these light rays.

Designs have been provided in which existing LED component packages and other electronics are assembled into a fixture. In such designs, a packaged LED is mounted to a circuit board or directly to a heat sink, the circuit board is mounted to a heat sink, and the heat sink is mounted to the fixture housing along with required drive electronics. In many cases, additional optics (secondary to the package parts) are also necessary.

There is an ongoing need for ways to use solid state light emitters, e.g., light emitting diodes, to provide light with greater energy efficiency and with acceptable color rendering index (CRI Ra).

BRIEF SUMMARY OF THE INVENTION(S)

In the case of conventional lighting devices which include a solid state light emitter (e.g., light emitting diode chip) and a lumiphor (e.g., LED packages), a significant proportion (e.g., in many cases, as much as 20% to 25% or more) of the excitation light (i.e., light from the LED) is reflected (back-scattered) from the lumiphor back into the solid state light emitter. Back-scattered light which is scattered back into the solid state light emitter (e.g., light emitting diode chip) itself has a very low probability of coming out of the solid state light emitter, and hence, such back-scattering results in a system loss of energy.

In addition, the lumiphor converted light is omni-directional, so that in general, 50% of the light is directed away from the source and 50% is directed back toward the source.

Furthermore, if the lumiphor is too thick, and/or if the luminescent material content in the lumiphor is too great, "self-absorption" may occur. Self-absorption occurs when light emissions within the packaging layer stay within the packaging layer to excite other luminescent material particles and eventually are absorbed or are otherwise prevented from exiting the device, thus reducing performance (intensity) and efficiency. Additionally, if the particle size of the luminescent material is too large, the particles of luminescent material can cause unwanted scattering of both light from the excitation source (e.g., the LED chip) and the light generated by the lumiphor.

As discussed below, in some embodiments of the present inventive subject matter, there is provided a lighting device which comprises a solid state light emitter, a filter and a lumiphor, in which most or all of the light emitted by the solid state light emitter passes through the filter and a portion of that light is absorbed by the lumiphor, and then a portion of any light emitted by the lumiphor which travels back toward the solid state light emitter is reflected by the filter so it can escape from the lighting device.

According to a first aspect of the present inventive subject matter, there is provided a lighting device, comprising at least a first solid state light emitter and at least a first light filter, in which the first solid state light emitter and the first light filter are positioned relative to one another such that if the first solid state light emitter is illuminated, the first solid state light emitter will emit first solid state emitter light and at least a portion of the first solid state emitter light will contact the first light filter. In this first aspect of the present inventive subject matter, the first light filter allows passage of at least some light having wavelength within a first solid state emitter range of wavelength (i.e., wavelengths of light emitted by the first solid state light emitter) and reflects at least some light having wavelength outside the first solid state emitter range of wavelength, such that if the first solid state light emitter is illuminated so that the first solid state light emitter emits the first solid state emitter light, at least a portion of the first solid state emitter light will pass through the first light filter.

In some embodiments according to this first aspect of the present inventive subject matter, the solid state light emitter is an LED chip.

In some embodiments according to this first aspect of the present inventive subject matter, if the first solid state light emitter is illuminated, the first solid state light emitter will emit first solid state emitter light, and at least 90 percent of the first solid state emitter light will pass through the first light filter.

In some embodiments according to this first aspect of the present inventive subject matter, if the first solid state light emitter is illuminated, the first solid state light emitter will emit light comprising light having a peak wavelength in the range of from 245 nm to 580 nm, and in some embodiments, from 380 nm to 490 nm.

In some embodiments according to this first aspect of the present inventive subject matter, the first light filter is mounted on the first solid state light emitter (e.g., on an LED chip).

In some embodiments according to this first aspect of the present inventive subject matter, the first light filter is in direct contact with the first solid state light emitter.

In some embodiments according to this first aspect of the present inventive subject matter, the lighting device further comprises at least a first lumiphor, and the first lumiphor is positioned relative to the first solid state light emitter and the first light filter such that if the first solid state light emitter is illuminated such that the first solid state light emitter emits the first solid state emitter light, at least a first portion of the first solid state emitter light passes through the first light filter and is absorbed by the first lumiphor, thereby exciting the first lumiphor such that the first lumiphor emits first lumiphor light, and at least a portion of the first lumiphor light is reflected by the first light filter. In some such embodiments, if the first solid state light emitter is illuminated:

(1) at least 50 percent (in some cases at least 60 percent, in some cases at least 70 percent, in some cases at least 80 percent, and in some cases at least 90 percent) of the first solid state emitter light will pass through the first light filter, and at least 20 percent (in some cases at least 30 percent, in some cases at least 40 percent, and in some cases at least 50 percent) of the first lumiphor light that contacts the first light filter is reflected by the first light filter; and/or (2) the first solid state light emitter will emit first solid state emitter light comprising light having a peak wavelength in the range of from 245 nm to 580 nm;

at least a portion of the first solid state emitter light will pass through the first light filter and be absorbed by the first lumiphor, thereby exciting the first lumiphor and causing the first lumiphor to emit first lumiphor light comprising light having a dominant wavelength in the range of from 555 nm to 700 nm; and at least a portion of the first lumiphor light will be reflected by the first light filter.

In some embodiments according to this first aspect of the present inventive subject matter, if the at least a first solid state light emitter is illuminated to produce a first illumination, a first portion of the light in said first illumination exits the lighting device without being absorbed by a lumiphor, a second portion of the first illumination is down-converted by at least one lumiphor which, when excited, emits down-converted light having a wavelength in the range of from 555 to 585, such that a mixture of (1) the first portion of the light in the first illumination and (2) the down-converted light which is not absorbed by any other lumiphor has x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38. In some such embodiments, the lighting device further comprises (1) one or more additional solid state light emitters which, when illuminated, emit light having a dominant wavelength in the range of from 600 nm to 630 nm, and/or (2) one or more additional lumiphors which, when excited, emit light having a dominant wavelength in the range of from 600 nm to 630 nm, and a combination of the light emitted by the one or more additional solid state light emitter(s) (if illuminated) and/or the light emitted by the one or more additional lumiphors, together with the mixture of (1) the first portion of the light in the first illumination and (2) the down-converted light which is not absorbed by any other lumiphor is within ten MacAdam ellipses of at least one point on the blackbody locus on a 1931 CIE Chromaticity Diagram (e.g., when power is supplied to a power cord to which the at least a first solid state light emitter is electrically connected).

In a second aspect of the present inventive subject matter, there is provided a method of lighting, comprising:

illuminating at least a first solid state light emitter to produce first solid state light emitter light, the first solid state light emitter being positioned relative to a first light filter such that at least a first portion of the first solid state emitter light passes through the first light filter, the first solid state light emitter and the first light filter being positioned relative to a first lumiphor such that at least some of the first portion of the first solid state emitter light is absorbed by the first lumiphor, thereby exciting the first lumiphor and causing the first lumiphor to emit first lumiphor light, and at least a portion of the first lumiphor light is reflected by the first light filter.

In a further aspect, the present inventive subject matter is directed to an enclosure, comprising an enclosed space and at least one lighting device as described above, wherein if the lighting device is illuminated, the lighting device would illuminate at least a portion of the enclosure.

In a further aspect, the present inventive subject matter is directed to a structure comprising a surface and at least one lighting device as described above, wherein if the lighting device is illuminated, the lighting device would illuminate at least a portion of the surface.

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

In some embodiments according to the present inventive subject matter, a mixture of all of the light exiting the lighting device has x, y coordinates on a 1931 CIE Chromaticity Diagram which define a point which is within seven MacAdam ellipses of at least one point on the blackbody locus on a 1931 CIE Chromaticity Diagram, and/or has u', v' coordinates within 0.01 of at least one point on the blackbody locus on a 1976 CIE Chromaticity Diagram.

In some embodiments according to the present inventive subject matter, a mixture of all of the light exiting the lighting device has a correlated color temperature of between 2,500 K and 10,000 K.

With regard to any mixed light described herein in terms of its proximity (in MacAdam ellipses) to the blackbody locus on a 1931 CIE Chromaticity Diagram, the present inventive subject matter is further directed to such mixed light in the proximity of light on the blackbody locus having color temperature of 2700 K, 3000 K or 3500 K, namely:

mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4578, 0.4101, the second point having x, y coordinates of 0.4813, 0.4319, the third point having x, y coordinates of 0.4562, 0.4260, the fourth point having x, y coordinates of 0.4373, 0.3893, and the fifth point having x, y coordinates of 0.4593, 0.3944 (i.e., proximate to 2700 K); or mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4338, 0.4030, the second point having x, y coordinates of 0.4562, 0.4260, the third point having x, y coordinates of 0.4299, 0.4165, the fourth point having x, y coordinates of 0.4147, 0.3814, and the fifth point having x, y coordinates of 0.4373, 0.3893 (i.e., proximate to 3000 K); or mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4073, 0.3930, the second point having x, y coordinates of 0.4299, 0.4165, the third point having x, y coordinates of 0.3996, 0.4015, the fourth point having x, y coordinates of 0.3889, 0.3690, and the fifth point having x, y coordinates of 0.4147, 0.3814 (i.e., proximate to 3500 K).

In a further aspect, the present inventive subject matter is directed to a light fixture comprising at least one lighting device as described above.

DETAILED DESCRIPTION OF THE INVENTION(S)

The present inventive subject matter now will be described more fully hereinafter with reference to the accompanying drawings, in which embodiments of the inventive subject matter are shown. However, this inventive subject matter should not be construed as limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When an element such as a layer, region or substrate is referred to herein as being "on" or extending "onto" another element, it can be directly on or extend directly onto the other element or intervening elements may also be present. In contrast, when an element is referred to herein as being "directly on" or extending "directly onto" another element, there are no intervening elements present. Also, when an element is referred to herein as being "connected" or "coupled" to another element, it can be directly connected or coupled to the other element or intervening elements may be present. In contrast, when an element is referred to herein as being "directly connected" or "directly coupled" to another element, there are no intervening elements present.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Furthermore, relative terms, such as "lower" or "bottom" and "upper" or "top," may be used herein to describe one element's relationship to another elements as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The expression "illumination" (or "illuminated"), as used herein when referring to a solid state light emitter, means that at least some current is being supplied to the solid state light emitter to cause the solid state light emitter to emit at least some light. The expression "illuminated" encompasses situations where the solid state light emitter emits light continuously or intermittently at a rate such that a human eye would perceive it as emitting light continuously, or where a plurality of solid state light emitters of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "excited", as used herein when referring to a lumiphor, means that at least some electromagnetic radiation (e.g., visible light, UV light or infrared light) is contacting the lumiphor, causing the lumiphor to emit at least some light. The expression "excited" encompasses situations where the lumiphor emits light continuously or intermittently at a rate such that a human eye would perceive it as emitting light continuously, or where a plurality of lumiphors of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "lighting device", as used herein, is not limited, except that it indicates that the device is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

A statement herein that two components in a device are "electrically connected," means that there are no components electrically between the components, the insertion of which materially affect the function or functions provided by the device. For example, two components can be referred to as being electrically connected, even though they may have a small resistor between them which does not materially affect the function or functions provided by the device (indeed, a wire connecting two components can be thought of as a small resistor); likewise, two components can be referred to as being electrically connected, even though they may have an additional electrical component between them which allows the device to perform an additional function, while not materially affecting the function or functions provided by a device which is identical except for not including the additional component; similarly, two components which are directly connected to each other, or which are directly connected to opposite ends of a wire or a trace on a circuit board or another medium, are electrically connected.

The expression "mounted on", as used herein, means that the first structure which is "on" a second structure can be in contact with the second structure, or can be separated from the second structure by one or more intervening structures (each side, or opposite sides, of which is in contact with the first structure, the second structure or one of the intervening structures).

The expression "in contact with", as used in the present specification (including in the preceding paragraph), means that the first structure which is "in contact with" a second structure can be in direct contact with the second structure, or can be separated from the second structure by one or more intervening structures (i.e., in indirect contact), where the first and second structures, and the one or more intervening structures each have at least one surface which is in direct contact with another surface selected from among surfaces of the first and second structures and surfaces of the one or more intervening structures.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As noted above, in the first aspect of the present inventive subject matter, there is provided a lighting device, comprising at least a first solid state light emitter and at least a first light filter.

Any desired solid state light emitter or emitters can be employed in accordance with the present inventive subject matter. Persons of skill in the art are aware of, and have ready access to, a wide variety of such emitters. Such solid state light emitters include inorganic and organic light emitters. Examples of types of such light emitters include a wide variety of light emitting diodes (inorganic or organic, including polymer light emitting diodes (PLEDs)), laser diodes, thin film electroluminescent devices, light emitting polymers (LEPs), a variety of each of which are well-known in the art (and therefore it is not necessary to describe in detail such devices, and/or the materials out of which such devices are made).

The respective light emitters can be similar to one another, different from one another or any combination (i.e., there can be a plurality of solid state light emitters of one type, or one or more solid state light emitters of each of two or more types)

As noted above, one type of solid state light emitter which can be employed are LED chips. Such LED chips can be selected from among any light emitting diode chips (a wide variety of which are readily obtainable and well known to those skilled in the art, and therefore it is not necessary to describe in detail such devices, and/or the materials out of which such devices are made). For instance, examples of types of light emitting diodes include inorganic and organic light emitting diodes, a variety of each of which are well-known in the art.

Persons skilled in the art are familiar with, and have ready access to, a variety of light filters which perform the functions of the light filters described herein. For instance, standard "band pass" (high/low or low/high filters) filters will transmit light in some wavelengths, e.g., high energy blue light, and will reflect longer wavelength light (such a filter thus acts as a "light diode" for selected wavelengths). Representative examples of a suitable light filter for use according to the present inventive subject matter include dichroic filter arrays marketed by Ocean Optics and VIS Short Pass Filters from Edmond Optics.

As noted above, in some embodiments of the present inventive subject matter, said lighting device further comprises at least a first lumiphor. The one or more luminescent materials, where included, can be any desired luminescent material. The one or more luminescent materials can be down-converting or up-converting, or can include a combination of both types. For example, the one or more luminescent materials can be selected from among phosphors, scintillators, day glow tapes, inks which glow in the visible spectrum upon illumination with ultraviolet light, etc.

The one or more luminescent materials can be provided in any desired form. For example, the luminescent element can be embedded in a resin (i.e., a polymeric matrix), such as a silicone material, an epoxy material, a glass material or a metal oxide material.

The one or more lumiphors can individually be any lumiphor, a wide variety of which, as noted above, are known to those skilled in the art. For example, the (or each of the) one or more lumiphor(s) can comprise (or can consist essentially of, or can consist of) one or more phosphor. The (or each of the) one or more lumiphors can, if desired, further comprise (or consist essentially of, or consist of) one or more highly transmissive (e.g., transparent or substantially transparent, or somewhat diffuse) binder, e.g., made of epoxy, silicone, glass, metal oxide or any other suitable material (for example, in any given lumiphor comprising one or more binder, one or more phosphor can be dispersed within the one or more binder). For example, the thicker the lumiphor, in general, the lower the weight percentage of the phosphor can be.

The (or each of the) one or more lumiphors can, independently, further comprise any of a number of well-known additives, e.g., diffusers, scatterers, tints, etc.

In some embodiments according to the present inventive subject matter, one or more solid state light emitters can be included in a package together with one or more light filters and one or more lumiphors. In some such embodiments, the one or more lumiphors in the package can be spaced from the one or more solid state light emitters in the package to achieve improved light extraction efficiency, as described in U.S. Patent Application No. 60/753,138, filed on Dec. 22, 2005, entitled "Lighting Device" (inventor: Gerald H. Negley) and U.S. patent application Ser. No. 11/614,180, filed Dec. 21, 2006, (now U.S. Patent Publication No. 2007/0236911), the entireties of which are hereby incorporated by reference.

In some embodiments according to the present inventive subject matter, two or more lumiphors can be provided, two or more of the lumiphors being spaced from each other, as described in U.S. Patent Application No. 60/794,379, filed on Apr. 24, 2006, entitled "Shifting Spectral Content in LEDs by Spatially Separating Lumiphor Films" (inventors: Gerald H. Negley and Antony Paul van de Ven) and U.S. patent application Ser. No. 11/624,811, filed Jan. 19, 2007, (now U.S. Patent Publication No. 2007/0170447), the entireties of which are hereby incorporated by reference.

Persons of skill in the art are familiar with, and have ready access to, a variety of materials used in packaging solid state light emitters (e.g., LED chips), and a variety of methods for packaging such solid state light emitters. Any of these materials and methods can be used in packaging the solid state light emitters, optionally together with one or more lumiphors, according to the present inventive subject matter.

Representative examples of suitable LED chips, combinations of LED chips and lumiphors, and packaged LEDs are described in:

(1) U.S. Patent Application No. 60/753,138, filed on Dec. 22, 2005, entitled "Lighting Device" (inventor: Gerald H. Negley) and U.S. patent application Ser. No. 11/614,180, filed Dec. 21, 2006, (now U.S. Patent Publication No. 2007/0236911), the entireties of which are hereby incorporated by reference;

(2) U.S. Patent Application No. 60/794,379, filed on Apr. 24, 2006, entitled "Shifting Spectral Content in LEDs by Spatially Separating Lumiphor Films" (inventors: Gerald H. Negley and Antony Paul van de Ven) and U.S. patent application Ser. No. 11/624,811, filed Jan. 19, 2007, (now U.S. Patent Publication No. 2007/0170447), the entireties of which are hereby incorporated by reference;

(3) U.S. Patent Application No. 60/808,702, filed on May 26, 2006, entitled "Lighting Device" (inventors: Gerald H. Negley and Antony Paul van de Ven) and U.S. patent application Ser. No. 11/751,982, filed May 22, 2007, (now U.S. Patent Publication No. 2007/0274080), the entireties of which are hereby incorporated by reference;

(4) U.S. Patent Application No. 60/808,925, filed on May 26, 2006, entitled "Solid State Light Emitting Device and Method of Making Same" (inventors: Gerald H. Negley and Neal Hunter) and U.S. patent application Ser. No. 11/753,103, filed May 24, 2007, (now U.S. Patent Publication No. 2007/0280624), the entireties of which are hereby incorporated by reference;

(5) U.S. Patent Application No. 60/802,697, filed on May 23, 2006, entitled "Lighting Device and Method of Making" (inventor: Gerald H. Negley) and U.S. patent application Ser. No. 11/751,990, filed May 22, 2007, (now U.S. Patent Publication No. 2007/0274063), the entireties of which are hereby incorporated by reference;

(6) U.S. Patent Application No. 60/839,453, filed on Aug. 23, 2006, entitled "LIGHTING DEVICE AND LIGHTING METHOD" (inventors: Antony Paul van de Ven and Gerald H. Negley) and U.S. patent application Ser. No. 11/843,243, filed Aug. 22, 2007, (now U.S. Patent Publication No. 2008/0084685), the entireties of which are hereby incorporated by reference;

(7) U.S. Patent Application No. 60/857,305, filed on Nov. 7, 2006, entitled "LIGHTING DEVICE AND LIGHTING METHOD" (inventors: Antony Paul van de Ven and Gerald H. Negley, the entirety of which is hereby incorporated by reference; and (8) U.S. Patent Application No. 60/851,230, filed on Oct. 12, 2006, entitled "LIGHTING DEVICE AND METHOD OF MAKING SAME" (inventor: Gerald H. Negley, the entirety of which is hereby incorporated by reference.

The lighting devices according to the present inventive subject matter can comprise any desired number of solid state light emitters and/or lumiphors. For example, a lighting device according to the present inventive subject matter can include one or more light emitting diode chips, can include 50 or more light emitting diode chips, or can include 100 or more light emitting diode chips, etc.

In some lighting devices according to the present inventive subject matter, there are further included one or more circuitry components, e.g., drive electronics for supplying and controlling current passed through at least one of the one or more light emitting diodes in the lighting device. Persons of skill in the art are familiar with a wide variety of ways to supply and control the current passed through light emitting diodes, and any such ways can be employed in the devices of the present inventive subject matter. For example, such circuitry can include at least one contact, at least one leadframe, at least one current regulator, at least one power control, at least one voltage control, at least one boost, at least one capacitor and/or at least one bridge rectifier, persons of skill in the art being familiar with such components and being readily able to design appropriate circuitry to meet whatever current flow characteristics are desired. In addition, any desired circuitry can be employed in order to supply energy to the lighting devices according to the present inventive subject matter. Representative examples of circuitry which may be used in practicing the present inventive subject matter is described in:

(1) U.S. Patent Application No. 60/752,753, filed on Dec. 21, 2005, entitled "Lighting Device" (inventors: Gerald H. Negley, Antony Paul van de Ven and Neal Hunter) and U.S. patent application Ser. No. 11/613,692, filed Dec. 20, 2006, (now U.S. Patent Publication No. 2007/0139923), the entireties of which are hereby incorporated by reference;

(2) U.S. Patent Application No. 60/798,446, filed on May 5, 2006, entitled "Lighting Device" (inventor: Antony Paul van de Ven) and U.S. patent application Ser. No. 11/743,754, filed May 3, 2007, (now U.S. Patent Publication No. 2007/0263393), the entireties of which are hereby incorporated by reference;

(3) U.S. Patent Application No. 60/809,959, filed on Jun. 1, 2006, entitled "Lighting Device With Cooling" (inventors: Thomas G. Coleman, Gerald H. Negley and Antony Paul van de Ven) and U.S. patent application Ser. No. 11/626,483, filed Jan. 24, 2007, (now U.S. Patent Publication No. 2007/0171145), the entireties of which are hereby incorporated by reference;

(4) U.S. Patent Application No. 60/809,595, filed on May 31, 2006, entitled "LIGHTING DEVICE AND METHOD OF LIGHTING" (inventor: Gerald H. Negley) and U.S. patent application Ser. No. 11/755,162, filed May 30, 2007, (now U.S. Patent Publication No. 2007/0279440), the entireties of which are hereby incorporated by reference;

(5) U.S. Patent Application No. 60/844,325, filed on Sep. 13, 2006, entitled "BOOST/FLYBACK POWER SUPPLY TOPOLOGY WITH LOW SIDE MOSFET CURRENT CONTROL" (inventor: Peter Jay Myers), and U.S. patent application Ser. No. 11/854,744, filed Sep. 13, 2007, (now U.S. Patent Publication No. 2008/0088248), the entireties of which are hereby incorporated by reference.

In some lighting devices according to the present inventive subject matter, there are further included one or more power sources, e.g., one or more batteries and/or solar cells, and/or one or more standard AC power plugs.

In addition, persons of skill in the art are familiar with a wide variety of mounting structures for many different types of lighting, and any such structures can be used according to the present inventive subject matter.

The one or more solid state light emitters in the lighting devices of the present inventive subject matter can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present inventive subject matter. The lighting devices of the present inventive subject matter can be electrically connected (or selectively connected) to any desired power source, persons of skill in the art being familiar with a variety of such power sources.

Representative examples of arrangements of sources of visible light, mounting structures, schemes for mounting sources of visible light, apparatus for supplying electricity to sources of visible light, housings for sources of visible light, fixtures for sources of visible light, power supplies for sources of visible light and complete lighting assemblies, all of which are suitable for the lighting devices of the present inventive subject matter, are described in:

(1) U.S. Patent Application No. 60/752,753, filed on Dec. 21, 2005, entitled "Lighting Device" (inventors: Gerald H. Negley, Antony Paul van de Ven and Neal Hunter) and U.S. patent application Ser. No. 11/613,692, filed Dec. 20, 2006, (now U.S. Patent Publication No. 2007/0139923), the entireties of which are hereby incorporated by reference;

(2) U.S. Patent Application No. 60/798,446, filed on May 5, 2006, entitled "Lighting Device" (inventor: Antony Paul van de Ven) and U.S. patent application Ser. No. 11/743,754, filed May 3, 2007, (now U.S. Patent Publication No. 2007/0263393), the entireties of which are hereby incorporated by reference;

(3) U.S. Patent Application No. 60/845,429, filed on Sep. 18, 2006, entitled "LIGHTING DEVICES, LIGHTING ASSEMBLIES, FIXTURES AND METHODS OF USING SAME" (inventor: Antony Paul van de Ven), and U.S. patent application Ser. No. 11/856,421, filed Sep. 17, 2007, (now U.S. Patent Publication No. 2008/0084700), the entireties of which are hereby incorporated by reference;

(4) U.S. Patent Application No. 60/846,222, filed on Sep. 21, 2006, entitled "LIGHTING ASSEMBLIES, METHODS OF INSTALLING SAME, AND METHODS OF REPLACING LIGHTS" (inventors: Antony Paul van de Ven and Gerald H. Negley), and U.S. patent application Ser. No. 11/859,048, filed Sep. 21, 2007, (now U.S. Patent Publication No. 2008/0084701), the entireties of which are hereby incorporated by reference;

(5) U.S. Patent Application No. 60/809,618, filed on May 31, 2006, entitled "LIGHTING DEVICE AND METHOD OF LIGHTING" (inventors: Gerald H. Negley, Antony Paul van de Ven and Thomas G. Coleman) and U.S. patent application Ser. No. 11/755,153, filed May 30, 2007, (now U.S. Patent Publication No. 2007/0279903), the entireties of which are hereby incorporated by reference;

(6) U.S. Patent Application No. 60/858,881, filed on Nov. 14, 2006, entitled "LIGHT ENGINE ASSEMBLIES" (inventors: Paul Kenneth Pickard and Gary David Trott), the entirety of which is hereby incorporated by reference;

(7) U.S. Patent Application No. 60/859,013, filed on Nov. 14, 2006, entitled "LIGHTING ASSEMBLIES AND COMPONENTS FOR LIGHTING ASSEMBLIES" (inventors: Gary David Trott and Paul Kenneth Pickard) and U.S. patent application Ser. No. 11/939,059, filed Nov. 13, 2007, (now U.S. Patent Publication No. 2008/0112170), the entireties of which are hereby incorporated by reference;

(8) U.S. Patent Application No. 60/853,589, filed on Oct. 23, 2006, entitled "LIGHTING DEVICES AND METHODS OF INSTALLING LIGHT ENGINE HOUSINGS AND/OR TRIM ELEMENTS IN LIGHTING DEVICE HOUSINGS" (inventors: Gary David Trott and Paul Kenneth Pickard), the entirety of which is hereby incorporated by reference;

(9) U.S. Patent Application No. 60/861,901, filed on Nov. 30, 2006, entitled "LED DOWNLIGHT WITH ACCESSORY ATTACHMENT" (inventors: Gary David Trott, Paul Kenneth Pickard and Ed Adams), the entirety of which is hereby incorporated by reference;

(10) U.S. Patent Application No. 60/916,384, filed on May 7, 2007, entitled "LIGHT FIXTURES, LIGHTING DEVICES, AND COMPONENTS FOR THE SAME" (inventors: Paul Kenneth Pickard, Gary David Trott and Ed Adams), the entirety of which is hereby incorporated by reference; and (11) U.S. Patent Application No. 60/858,558, filed on Nov. 13, 2006, entitled "LIGHTING DEVICE, ILLUMINATED ENCLOSURE AND LIGHTING METHODS" (inventor: Gerald H. Negley), the entirety of which is hereby incorporated by reference.

The present inventive subject matter further relates to an illuminated enclosure (the volume of which can be illuminated uniformly or non-uniformly), comprising an enclosed space and at least one lighting device according to the present inventive subject matter, wherein the lighting device illuminates at least a portion of the enclosure (uniformly or non-uniformly).

The present inventive subject matter further relates to an illuminated surface, comprising a surface and at least one lighting device according to the present inventive subject matter, wherein the lighting device illuminates at least a portion of the surface.

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

One or more brightness enhancement films can optionally further be included in the lighting devices according to this aspect of the present inventive subject matter. Such films are well-known in the art and are readily available. Brightness enhancement films (e.g., BEF films commercially available from 3M) are optional—when employed, they provide a more directional light source by limiting the acceptance angle. Light not "accepted" is recycled by the highly reflective light source enclosure. Preferably, the brightness enhancement films (which can optionally be replaced by one or more extraction films, such as by WFT), if employed, are optimized to limit the viewing angle of the emitted source and to increase the probability of extracting light on the first (or earliest possible) pass.

In addition, one or more scattering elements (e.g., layers) can optionally be included in the lighting devices according to this aspect of the present inventive subject matter. The scattering element can be included in a lumiphor, and/or a separate scattering element can be provided. A wide variety of separate scattering elements and combined luminescent and scattering elements are well known to those of skill in the art, and any such elements can be employed in the lighting devices of the present inventive subject matter.

Embodiments in accordance with the present inventive subject matter are described herein with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

Figure 4:
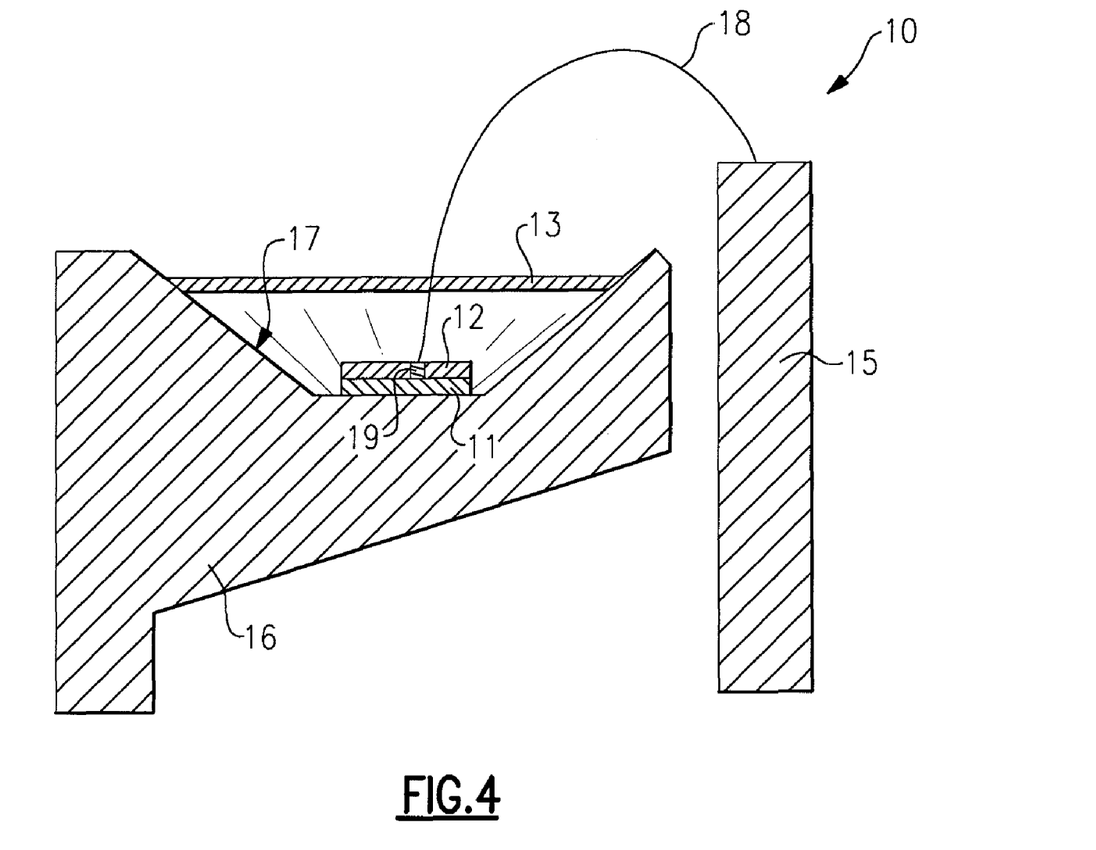
FIG. 4 depicts a first embodiment of a lighting device according to the present inventive subject matter.

FIG. 4 depicts a first embodiment of a lighting device according to the present inventive subject matter. Referring to FIG. 4, there is shown a lighting device 10 which comprises an LED chip 11, a first light filter 12 and a first lumiphor 13.

The LED chip 11 and the first light filter 12 are positioned relative to one another such that if the LED chip 11 is illuminated, the LED chip 11 will emit first solid state emitter light, and at least a portion of the first solid state emitter light will contact the first light filter 12.

The first light filter 12 allows passage of at least some light having wavelength within a first solid state emitter range of wavelength and reflects at least some light having wavelength outside the first solid state emitter range of wavelength, the first solid state emitter range of wavelength consisting of wavelengths of light emitted by the LED chip 11 if the LED chip 11 is illuminated, such that if the LED chip 11 is illuminated so that it emits first solid state emitter light, at least a portion of the first solid state emitter light will pass through the first light filter 12.

As shown in FIG. 4, the first light filter 12 is mounted on the LED chip 11.

The LED chip 11, if illuminated, emits light comprising light having a peak wavelength in the range of from 380 nm to 490 nm.

The first lumiphor is positioned relative to the LED chip 11 and the first light filter 12 such that if the LED chip 11 is illuminated and emits first solid state emitter light, at least a first portion of the first solid state emitter light passes through the first light filter 12 and is absorbed by the first lumiphor 13, thereby exciting the first lumiphor 13, such that the first lumiphor 13 emits first lumiphor light having a dominant wavelength in the range of from 555 nm to 585 nm, and at least a portion of the first lumiphor light is reflected by the first light filter 12.

FIG. 4 also depicts a leadframe which comprises a first lead 15 and a second lead 16. The first lead 15 includes a reflective cup 17. A first wire 18 connects the first lead 15 to a contact 19 which is in direct contact with a surface of the LED chip 11.

In other embodiments, the LED chip 11 can emit light have a peak and/or dominant wavelength in the range of from 245 nm to 580 nm.

The present inventive subject matter includes lighting devices in which green light is emitted from one or more solid state light emitter and the green light is down-converted with a lumiphor which emits red light, and a filter is provided which (1) allows a first portion of the green light emitted by the solid state light emitter to pass through the filter and which (2) reflects at least a portion of the red light emitted by the lumiphor and directed back toward the chip. Such lighting devices can be red LEDs (substantially all of the green light is down-converted to red) or yellow LEDs (down-converted red light is mixed with non-down-converted green light).

The present inventive subject matter further includes lighting devices in which UV light is emitted from one or more solid state light emitter and the UV light is down-converted with a lumiphor which emits visible light, and a filter is provided which (1) allows a first portion of the UV light emitted by the solid state light emitter to pass through the filter and which (2) reflects at least a portion of the visible light emitted by the lumiphor and directed back toward the chip. Such lighting devices can be LEDs of any desired color (e.g., based on the nature of the luminescent material or mixture of luminescent materials included in the lumiphor(s)).

The lighting devices according to the present inventive subject matter can be employed in LED arrays. For example, the lighting devices according to the present inventive subject matter can be used in LCD backlights, or in lighting fixtures in which the lumiphor(s) is/are separated from the LED array.

The present inventive subject matter also includes devices which include one or more solid state lasers and one or more filters, e.g., where IR lasers are used to excite lithium crystals to make a green laser.

Any two or more structural parts of the lighting devices described herein can be integrated. Any structural part of the lighting devices described herein can be provided in two or more parts (which can be held together, if necessary).

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

The invention claimed is:

1. A lighting device, comprising:
   at least a first solid state light emitter;
   at least a first light filter, and
   at least a first luminescent material-containing structure,
   said first solid state light emitter and said first light filter being positioned relative to one another such that if said first solid state light emitter is illuminated, said first solid state light emitter will emit first solid state emitter light, and at least a portion of said first solid state emitter light will exit said first light filter,
   said first light filter allowing passage of at least some light having wavelength within a first solid state emitter range of wavelength and reflecting at least some light having wavelength outside said first solid state emitter range of wavelength, said first solid state emitter range of wavelength consisting of wavelengths of light emitted by said first solid state light emitter if said first solid state light emitter is illuminated, such that if said first solid state light emitter is illuminated so that said first solid state light emitter emits said first solid state emitter light, at least a portion of said first solid state emitter light will pass through said first light filter,
   said first light filter in direct contact with said first solid state light emitter,
   said first luminescent material-containing structure spaced from said first light filter.

2. A lighting device as recited in claim 1, wherein said first solid state light emitter is an LED chip.

3. A lighting device as recited in claim 2, wherein said first light filter is mounted on said LED chip.

4. A lighting device as recited in claim 1, wherein if said first solid state light emitter is illuminated, said first solid state light emitter will emit first solid state emitter light, and at least 90 percent of said first solid state emitter light will pass through said first light filter.

5. A lighting device as recited in claim 1, wherein if said first solid state light emitter is illuminated, said first solid state light emitter will emit light comprising light having a peak wavelength in the range of from 380 nm to 490 nm.

6. A lighting device as recited in claim 1, wherein said first light filter is mounted on said first solid state light emitter.

7. A lighting device as recited in claim 1, wherein said first luminescent material-containing structure is a first lumiphor, said first lumiphor being positioned relative to said first solid state light emitter and said first light filter such that if said first solid state light emitter is illuminated such that said first solid state light emitter emits said first solid state emitter light:
   at least a first portion of said first solid state emitter light passes through said first light filter and is absorbed by said first lumiphor, thereby exciting said first lumiphor such that said first lumiphor emits first lumiphor light, and at least a portion of said first lumiphor light is reflected by said first light filter.

8. A lighting device as recited in claim 7, wherein if said first solid state light emitter is illuminated, at least 90 percent of said first solid state emitter light will pass through said first light filter, and at least 50 percent of said first lumiphor light that reaches said first light filter will be reflected by said first light filter.

9. A lighting device as recited in claim 7, wherein:
   if said first solid state light emitter is illuminated, said first solid state light emitter will emit first solid state emitter light comprising light having a peak wavelength in the range of from 380 nm to 490 nm;
   at least a portion of said first solid state emitter light will pass through said first light filter and be absorbed by said first lumiphor, thereby exciting said first lumiphor and causing said first lumiphor to emit first lumiphor light comprising light having a dominant wavelength in the range of from 555 nm to 585 nm; and
   at least a portion of said first lumiphor light will be reflected by said first light filter.

10. A lighting device as recited in claim 7, wherein said first solid state light emitter, said first lumiphor and said first light filter are all contained in a first package, said first package further comprising at least one encapsulant.

11. A lighting device as recited in claim 7, wherein said first lumiphor is spaced from said first solid state light emitter.

12. A lighting device as recited in claim 1, wherein if said first solid state light emitter is illuminated, said lighting device will emit illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

13. A lighting device as recited in claim 1, wherein said first solid state light emitter and said first light filter are both contained in a first package, said first package further comprising at least one encapsulant.

14. A lighting device as recited in claim 1, wherein said lighting device further comprises at least one power line, and if electricity is supplied to said at least one power line, a mixture of all of the light exiting the lighting device would have x, y coordinates on a 1931 CIE Chromaticity Diagram which define a point which is within seven MacAdam ellipses of at least one point on the blackbody locus on a 1931 CIE Chromaticity Diagram.

15. A lighting device as recited in claim 1, wherein said lighting device further comprises at least one power line, and if electricity is supplied to said at least one power line, a mixture of all of the light exiting the lighting device would have u',v' coordinates within 0.01 of at least one point on the blackbody locus on a 1976 CIE Chromaticity Diagram.

16. A lighting device as recited in claim 1, wherein said lighting device further comprises at least one power line, and if electricity is supplied to said at least one power line, a mixture of all of the light exiting the lighting device would have a correlated color temperature of between 2,500 K and 10,000 K.

17. An enclosure, comprising an enclosed space and at least one lighting device as recited in claim 1, wherein if said first solid state light emitter is illuminated, said lighting device would illuminate at least a portion of said enclosed space.

18. A structure comprising a surface and at least one lighting device as recited in claim 1, wherein if said first solid state light emitter is illuminated, said lighting device would illuminate at least a portion of said surface.

19. An illuminated area, comprising at least one item selected from among the group consisting of a structure, a swimming pool or spa, a room, a warehouse, an indicator, a road, a parking lot, a vehicle, signage, road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard and a lamppost, having mounted therein or thereon at least one lighting device as recited in claim 1.

20. A method of lighting, comprising:
illuminating at least a first solid state light emitter to produce first solid state light emitter light, said first solid state light emitter being positioned relative to a first light filter such that at least a first portion of said first solid state emitter light passes through said first light filter,
said first solid state light emitter and said first light filter being positioned relative to a first lumiphor such that at least some of said first portion of said first solid state emitter light is absorbed by said first lumiphor, thereby exciting said first lumiphor and causing said first lumiphor to emit first lumiphor light, and at least a portion of said first lumiphor light is reflected by said first light filter,
said first light filter in direct contact with said first solid state light emitter,
said first lumiphor spaced from said first light filter.

21. A method as recited in claim 20, wherein at least 90 percent of said first solid state emitter light passes through said first light filter.

22. A method as recited in claim 20, wherein said first solid state emitter light has a peak wavelength in the range of from 380 nm to 490 nm.

23. A method as recited in claim 20, wherein at least 90 percent of said first solid state emitter light passes through said first light filter, and at least 50 percent of said first lumiphor light that reaches said first light filter is reflected by said first light filter.

24. A lighting device, comprising:
at least a first solid state light emitter;
at least a first lumiphor; and
filter means for allowing at least a first portion of light emitted by said first solid state light emitter to pass through and for reflecting at least a second portion of light which is emitted by said first lumiphor after said first lumiphor is excited by at least part of said first portion of light.

25. A lighting device as recited in claim 24, wherein said first solid state light emitter is an LED chip.

26. A lighting device as recited in claim 25, wherein said filter means is mounted on said LED chip.

27. A lighting device as recited in claim 24, wherein if said first solid state light emitter is illuminated, said first solid state light emitter will emit first solid state emitter light, and at least 90 percent of said first solid state emitter light will pass through said filter means.

28. A lighting device as recited in claim 24, wherein if said first solid state light emitter is illuminated, said first solid state light emitter will emit light comprising light having a peak wavelength in the range of from 380 nm to 490 nm.

29. A lighting device as recited in claim 24, wherein if said first solid state light emitter is illuminated, at leak 90 percent of said first solid state emitter light will pass through said filter means, and at least 50 percent of said second portion of light that reaches said filter means will be reflected by said filter means.

30. A lighting device as recited in claim 24, wherein:
if said first solid state light emitter is illuminated, said first solid state light emitter will emit first solid state emitter light comprising light having a peak wavelength in the range of from 380 nm to 490 nm;
at least a portion of said first solid state emitter light will pass through said filter means and be absorbed by said first lumiphor, thereby exciting said first lumiphor and causing said first lumiphor to emit first lumiphor light comprising light having a dominant wavelength in the range of from 555 nm to 585 nm; and
at least a portion of said first lumiphor light will be reflected by said filter means.

31. A lighting device as recited in claim 24, wherein said first solid state light emitter, said first lumiphor and said filter means are all contained in a first package, said first package further comprising at least one encapsulant.

32. A lighting device as recited in claim 24, wherein said first lumiphor is spaced from said first solid state light emitter.

33. A lighting device as recited in claim 24, wherein if said first solid state light emitter is illuminated, said lighting device will emit illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

* * * * *

UNITED STATES PATENT AND TRADEMARK OFFICE
CERTIFICATE OF CORRECTION

| | |
|---|---|
| PATENT NO. | : 7,901,111 B2 |
| APPLICATION NO. | : 11/947323 |
| DATED | : March 8, 2011 |
| INVENTOR(S) | : Gerald H. Negley, Antony Paul Van De Ven and Paul Kenneth Pickard |

It is certified that error appears in the above-identified patent and that said Letters Patent is hereby corrected as shown below:

Title Page, Item (56) References Cited- Other Publications (page 2):
  *please change* "Cree®XLamp® XR-E Series LED Binning and Labeling" to
--Cree®XLamp® 7090 XR-E Series LED Binning and Labeling--

Column 22
*Line 18*: claim 29 please change "leak" to --least--

Signed and Sealed this
Twenty-fourth Day of May, 2011

David J. Kappos
*Director of the United States Patent and Trademark Office*